United States Patent [19]

Adlerstein

[11] Patent Number: 4,939,562
[45] Date of Patent: Jul. 3, 1990

[54] HETEROJUNCTION BIPOLAR TRANSISTORS AND METHOD OF MANUFACTURE

[75] Inventor: Michael G. Adlerstein, Wellesley, Mass.

[73] Assignee: Raytheon Company, Lexington, Mass.

[21] Appl. No.: 334,350

[22] Filed: Apr. 7, 1989

[51] Int. Cl.$^5$ ............................................. H01L 29/72
[52] U.S. Cl. ........................................ 357/34; 357/16; 357/36; 357/47; 357/81
[58] Field of Search ...................... 357/16, 34, 47, 81, 357/34 HB, 36

[56] References Cited

U.S. PATENT DOCUMENTS

| | | | |
|---|---|---|---|
| 4,586,071 | 4/1986 | Tiwari | 357/16 |
| 4,661,836 | 4/1987 | Mun | 357/81 |
| 4,679,305 | 7/1987 | Morizuka | 357/34 |
| 4,692,791 | 9/1987 | Bayraktaroglu | 357/81 |
| 4,758,870 | 7/1988 | Hase et al. | 357/16 |

FOREIGN PATENT DOCUMENTS

| | | | |
|---|---|---|---|
| 0288681 | 11/1988 | European Pat. Off. | 357/16 |
| 63-48859 | 3/1988 | Japan | 357/16 |

OTHER PUBLICATIONS

"Non-Alloyed Submicron Resonant Tunneling Device", *IBM Technical Disclosure Bulletin*, Mar. 1989, vol. 31, No. 10, pp. 150–152.

Fritz et al., "Critical Layer Thickness in $In_{0.2}Ga_{0.8}As$/GaAs Single Strained Quantum Well Structures", *Applied Physics*, Sep. 28, 1987, vol. 51, No. 13, pp. 1004–1006.

G. J. Sullivan et al., "AlGaAs/InGaAs/GaAs Strained-Layer Heterojunction Bipolar Transistors by Molecular Beam Epitaxy", Electronics Letters, vol. 22, No. 8, Apr. 10, 1986, pp. 419–421.

Herbert Kroemer, "Heterostructure Bipolar Transistors and Integrated Circuits", Proceedings of the IEEE, vol. 70, No. 1, Jan. 1982, pp. 13–25.

B. Bayraktaroglu et al., "AlGaAs/GaAs Heterojunction Bipolar Transistors for Power Applications", IEEE, (1987), pp. 265–273.

Naresh Chand et al., "Doping Effects and Compositional Grading in $Al_xGa_{1-x}As$/GaAs Heterojunction Bipolar Transistors", IEEE Transactions on Electron Devices, vol. ED-32, No. 6, Jun. 1985, pp. 1064–1069.

Mukunda B. Das, "High-Frequency Performance Limitations of Millimeter-Wave Heterojunction Bipolar Transistors", IEEE Transactions on Electron Devices, vol. 35, No. 5, May 1988, pp. 604–614.

Mau-Chung F. Chang et al., "AlGaAs/GaAs Heterojunction Bipolar Transistors Fabricated Using a Self-Aligned Dual-Lift-Off Process", IEEE Electron Device Letters, vol. EDL-8, No. 7, Jul. 1987, pp. 303–305.

*Primary Examiner*—Andrew J. James
*Assistant Examiner*—Courtney A. Bowers
*Attorney, Agent, or Firm*—Denis G. Maloney; Richard M. Sharkansky

[57] ABSTRACT

A heterojunction bipolar transistor for high power applications in the microwave and millimeter wave regions is described. The heterojunction bipolar transistor includes a substrate having disposed thereover an emitter layer comprised of doped aluminum gallium arsenide and a composite base layer including a first layer of doped gallium arsenide disposed on the emitter to form a heterojunction. A second layer of doped indium gallium arsenide is disposed on the first base layer to provide a composite base. Disposed over the indium gallium arsenide layer is a gallium arsenide layer which acts as the collector. When etching the gallium arsenide layer to define the collector, the indium gallium arsenide layer acts as an etch stop to protect the underlying gallium arsenide layer and provide a smooth bath region to form base contacts. Emitter contact is provided to this device by etching via holes to electrically and thermally connect the emitter contact to a ground plane conductor, thus providing a heterojunction bipolar transistor in common emitter configuration. In an alternate embodiment, a composite emitter of a narrow band gap etch stop layer and wide band gap layers are provided. The composite emitter acts as an etch stop during via hole definition and facilitates ohmic contact to the emitter.

18 Claims, 6 Drawing Sheets

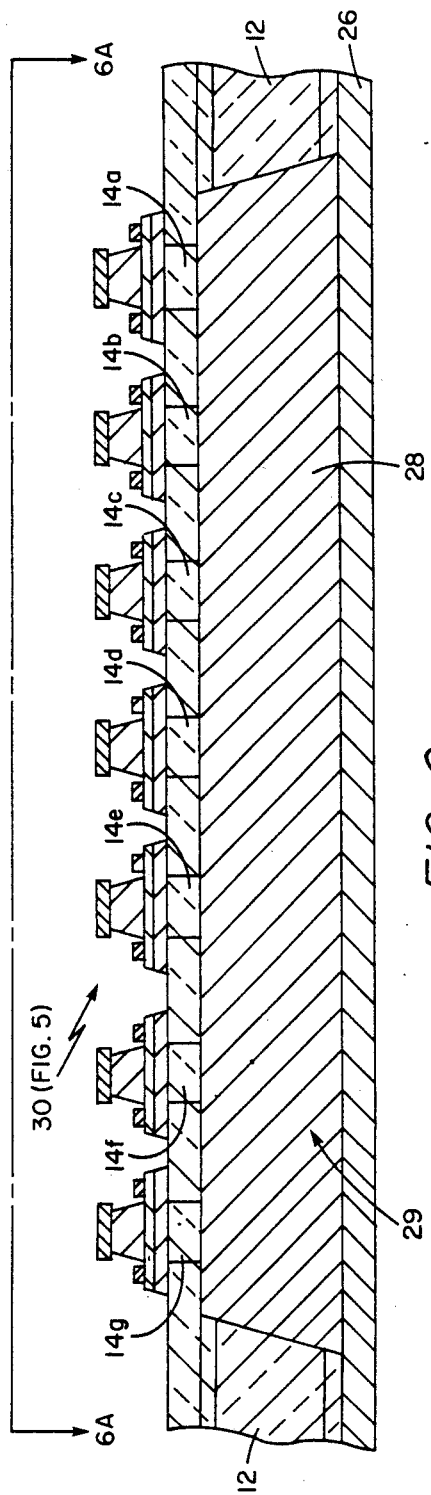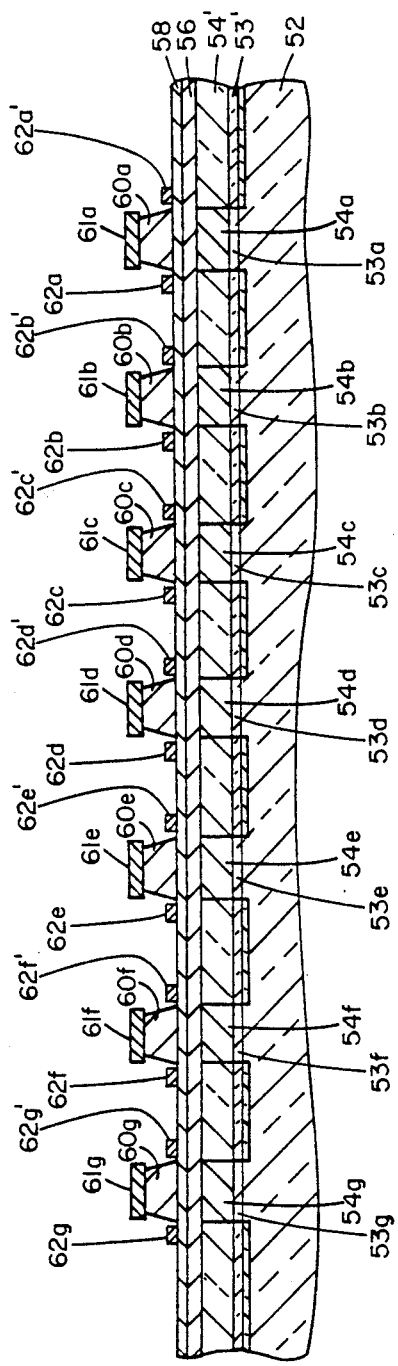

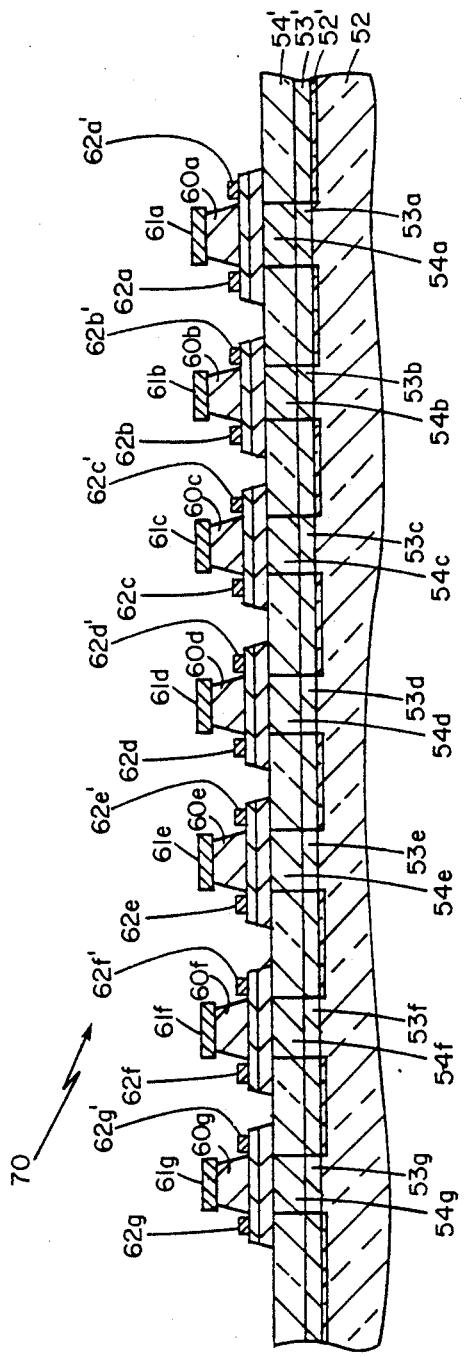
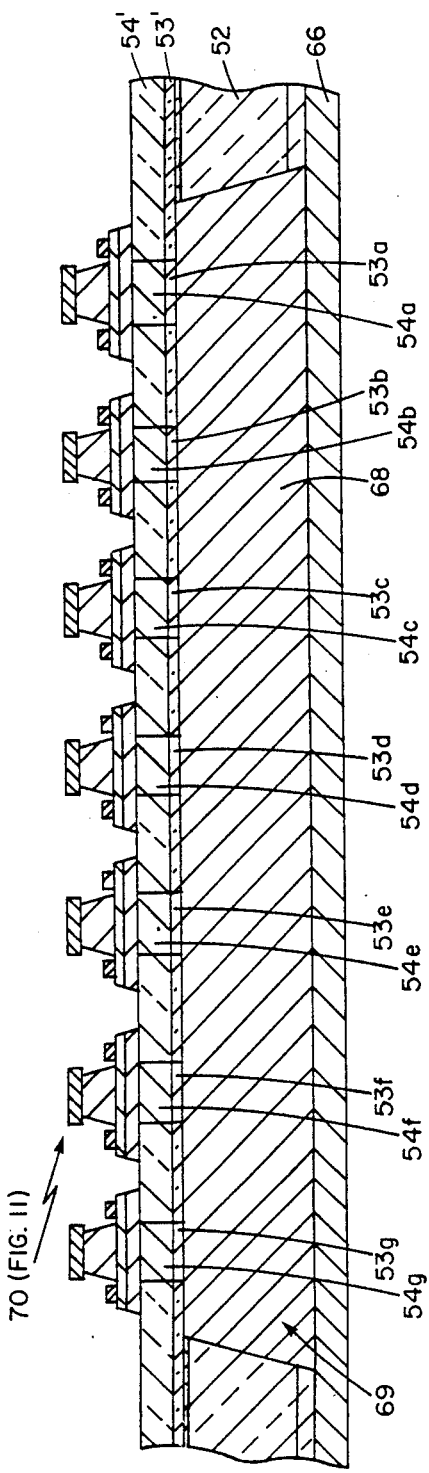
FIG. 11
FIG. 12

HETEROJUNCTION BIPOLAR TRANSISTORS AND METHOD OF MANUFACTURE

BACKGROUND OF THE INVENTION

This invention relates generally to semiconductor devices and more particularly to bipolar transistors.

As is known in the art, there exist a trend towards miniaturization of microwave and millimeter wave functions by use of monolithic microwave and millimeter wave integrated circuit technologies. It is also known that very high electron mobilities in Group III-V materials such as gallium arsenide make such materials preferred materials over more conventional semiconductor materials such as silicon for devices having a very high frequency of operation.

Most work in monolithic microwave integrated circuit technology involving gallium arsenide had centered around the field effect transistor, in particular the metal electrode semiconductor field effect transistor (MESFET), the high electron mobility transistor (HEMT), and the pseudomorphic transistor (PHEMT). In each of these devices, the principle feature of operation is that current in the device is carried parallel to the semiconductor surface. These transistors include ohmic source and drain electrodes which are disposed to make contact to a channel region. The electrical conductivity of the channel region is controlled by a gate electrode having a fairly short gate length, typically between 0.25 microns for very high frequency devices up to about 1 micron for lower frequency devices. In operation of such transistors, the source-drain current (i.e. channel current) has an upper limit which is related to the channel thickness. The maximum channel thickness, however, is determined by the maximum thickness which can be controlled by a gate electrode having a specified length. Further, to carry high channel current, the channel doping concentration should be relatively high. A high channel doping concentration, however, reduces the gate to source breakdown voltage. Since high breakdown voltages and high channel current are both desired for high output power, the relationship between channel doping and breakdown voltage electronically limits output power capabilities. Thus, output power from such millimeter wave and microwave FETS is limited significantly by electronic considerations rather than thermal considerations. Thus only a slight improvement in power can be obtained by using such devices in the pulse mode of operation.

One device which has been suggested as an alternative to the field effect transistor described above in particular for high power applications is the heterojunction bipolar transistor (HBT). The HBT as also the conventional bipolar transistor includes collector, base, and emitter layers disposed to form a pair of junctions. In general, a bipolar transistor is a three terminal device in which the upper layers (i.e. the base and emitter layers) are etched away in order to expose the underlying collector layer. Contacts are made to each of the layers to provide the three terminal device having a collector, emitter, and base contacts. Generally, for an NPN type of device where the P material is the base layer, a hole current is injected into the base which produces in response an electron current across the emitter-base junction. If the hole current can be made relatively small in comparison to the emitter current which is produced across the emitter-base junction in response to the hole or base current, then the relatively small hole current can control a relatively large emitter current and the difference between the amount of hole current and the amount of emitter current produced will provide amplification.

In silicon device technology, p-type and n-type dopants having relatively similar and relatively high hole and electron mobilities respectively are available which has permitted the development of a practical bipolar transistor with the use of alternating conductivity-type doped silicon layers. P-type doped gallium arsenide layers, however, have significantly lower hole mobilities than the electron mobilities of N-type doped GaAs. This problem has prevented practical development of a bipolar gallium arsenide transistor.

To overcome this problem, the heterojunction bipolar transistor (HBT) was conceived. The heterojunction bipolar transistor differs from the standard bipolar transistor in that the HBT incorporates an emitter material having a wider band gap energy than the band gap energy of material used in the base. This arrangement provides an abrupt energy discontinuity at the base-emitter junction. This discontinuity acts as a barrier to hole current which permits substantially higher p-type doping concentration in the base. Higher p-type doping compensates for the low hole mobility of p-type material in gallium arsenide thus making HBT devices practical.

The conventional III-V compound semiconductor HBT includes a semi-insulating gallium arsenide substrate having disposed thereover n-type doped gallium arsenide to form the collector layer, and p-type doped gallium arsenide to form the base layer. These layers form a first PN junction i.e. base-collector junction. Disposed over the base layer is an emitter layer of a wide band gap material such as aluminum gallium arsenide having a suitable compositional ratio of aluminum to gallium, typically of approximately 30% aluminum. This layer in combination with the base layer provides a base-emitter heterojunction.

Several problems exist with this structure, commonly referred to as the "collector down" structure. The first set of problems involves the difficulties in fabricating such a device. Since most chemical etchants dissolve gallium arsenide, it is difficult to find a selective etchant which will etch the emitter layer and stop at the base layer to allow contact formation to the base. Moreover, if a selective chemical etchant were found which etched the AlGaAs but not the GaAs it is likely that the selective chemical etchant would nevertheless provide non-uniform surfaces over the base which would make good ohmic contact to the base layer more difficult resulting in reduced device yield. Moreover, providing good ohmic contact with low contact resistance to p-type GaAs is also relatively difficult.

With the collector/down structure, it is also difficult to ground the emitter. In general, many applications for HBTS call for a grounded emitter. A typical "collector down" HBT would include a plurality of cells including emitter-base-collector regions disposed laterally across a composite transistor structure. The collector, base, and emitter cells would be electrically contacted by spaced conductive fingers disposed on said cells which would be connected together at respective common collector, base, and emitter electrodes. It is relatively easy to interconnect the base fingers and the collector fingers on the top surface of the semiconductor substrate. However, in order to connect the emitter fingers, it is required to form an airbridge overlay across the collector and base regions. An airbridge overlay is generally undesirable. The airbridge overlay provides associated parasitic resistance and inductance, as well as, fabrication difficulties during manufacturing of the transistor. Moreover, in the grounded emitter configuration, the more commonly used configuration, it is required to ground the emitter from the upper surface of the device. This also presents a problem at microwave and millimeter wave frequencies. Further, since the HBT is an inherently thermally limited device rather than an electronic limited device as is the field effect transistor, it would be highly desirable to provide good thermal heatsinking of the emitter base junction. The arrangement described above, however, does not provide such a capability, since gallium arsenide has relatively poor thermal conductivity, and the emitter-base junction is separated from the heatsink on the GaAs substrate by the collector-base junction. A final problem with the devices described above involves the parasitic capacitance between the base and the collector. Since the base is defined by etching through the emitter to expose the underlying base layer, there exists a substantial portion of the base layer which is in contact with the collector layer but is not in contact with the emitter layer. This provides a depletion region at the junction which has to be charged and discharged during operation of HBT resulting in degraded performance at high operating frequencies.

Several solutions have been proposed in the art to address individually some of the problems mentioned above. One proposed solution is the so-called "emitter down" HBT or "collector up" HBT, as proposed by Kroemer, Hetero-Structure Bipolar Transistors and Integrated Circuits, Proceedings of IEEE, Vol. 70, No. 1, January 1982. Kroemer describes the device as a "collector up" structure in which the emitter is disposed on the substrate and has a larger area than the collector. The collector is diffused into a relatively wide base layer and is provided planar with the base. Since a base, collector P-N junction is formed completely around the collector, only such areas of the emitter directly underlying the collector contribute to charge injection. Kroemer indicates that certain device electronic advantages such as reduced collector base capacitance result with such a structure, since the area of the collector is reduced by having the collector as a top layer which is diffused through the underlying base region.

A second type of HBT transistor is described in an article entitled AlGaAs/InGaAs/GaAs Strained Layer HBT, Heterojunction Bipolar Transistor by Sullivan et al., Electronics Letters, Apr. 10, 1986, Vol. 22, No. 8, pp. 419–421. In this paper, the authors describe the use of a low band gap material such as indium gallium arsenide for the base material in an emitter up structure. The motivation for use of the indium gallium arsenide in this arrangement is to provide an effective increase in hole mobility in the base. A potential drawback with this approach is that the Al content of the AlGaAs emitter is reduced. This results because InGaAs has a narrower band gap than GaAs. The authors speculate as to whether or not improved performance may be obtained from such an arrangement.

Nevertheless, it would be desirable to provide a HBT structure which takes advantage of the thermally limited nature of a bipolar transistor, which is relatively easy to fabricate, which facilitates fabrication of low resistivity ohmic base, collector and emitter contacts, has reduced base parasitic capacitance and inherently has lower thermal resistance between the base-emitter junction and heatsink.

SUMMARY OF THE INVENTION

In accordance with the present invention, a heterojunction bipolar transistor having base, collector and emitter electrodes includes a substrate having first and second opposing surfaces with a ground plane conductor disposed over a first surface thereof. Disposed over a second surface of said substrate is a first layer comprised of a first Group III-V material having a wide band gap such as AlGaAs, said first material being doped with an n-type dopant. Disposed over the first layer is a second layer of a second, different Group III-V material such as GaAs having a band gap which is narrower than the band gap of the material of the first layer, said second material being doped with a p-type dopant, with said first and second layers being disposed to provide a heterojunction. A third layer of a third, different Group III-V material such as InGaAs, said third material having a lower band gap than the band gap of the first and second materials, is disposed over the second layer. The third layer is doped p-type. A fourth layer of said second, Group III-V also doped n-type is disposed over the third layer. Contacts are provided over the fourth layer to form the collector of the transistor, and over the third layer to form in combination with the underlying second layer a composite base for the transistor. A via hole is disposed through the substrate to interconnect the ground plane conductor on the first surface of the substrate with the first layer, to thereby provide a grounded emitter contact for the first layer. With this particular arrangement, an improved "emitter down" type of HBT is provided. The "emitter down" arrangement in combination with the via hole provides substantial improvements in the thermal conductivity of the device which will improve power capabilities by reducing the thermal resistance between the base emitter junction and the thermally conductive ground plane conductor over the substrate. Further, the third layer of a third, different Group III-V material having a narrower band gap than the band gap of the first and second materials provides two additional advantages. The first advantage is that the narrow band gap III-V material provides better ohmic contact to a conductor disposed thereover (i.e. the base contact) than that provided by contact to a wider band gap III-V material. Secondly, the narrow band gap III-V material will act as a stop etch layer when the fourth layer of the second Group III-V is etched to form the collector and expose the base to provide base contacts over the base layer. These advantages are provided while still retaining the conventional, GaAs-AlGaAs heterojunction. Thus, the use of the composite base of InGaAs-GaAs with the InGaAs layer as a stop etch layer in contact with the collector rather than as the layer which makes contact with the emitter provides advantages to device fabrication and base contact while preserving the advantages of using a gallium arsenide/aluminum gallium arsenide junction layer.

In accordance with a further aspect of the present invention, a heterojunction bipolar transistor having emitter, base, and collector electrodes includes a substrate having first and second opposing surfaces with a ground plane conductor disposed over a first surface thereof. Disposed over a second surface of said substrate is a first layer comprised of a first Group III-V material such as n-type doped InGaAs having a narrow band gap. Disposed over the first layer is a second layer of a second, different n-type doped Group III-V material such as AlGaAs having a band gap which is substantially wider than the band gap of the material of the first layer. A third layer of a third, different p-type doped Group III-V material such as GaAs is disposed over the second layer forming a heterojunction with the second layer, with the third layer of the third material having a band gap between that of the first and second materials. A fourth layer of said first Group III-V material having a p-type dopant is disposed over the third layer and provides a composite base in combination with the underlying third layer. A fifth layer comprised of the third material with an n-type dopant is disposed over the fourth layer. Contacts are provided over the fifth layer to form the collector of the transistor and over the fourth layer to form in combination with the underlying third layer a composite base for the transistor. A via hole is disposed through the substrate to interconnect the ground plane conductor on the first surface of the substrate with the first layer, thereby providing a grounded emitter contact for the composite emitter. With this particular arrangement, by incorporating InGaAs layers between base and collector, and emitter and substrate a HBT is provided which is easier to fabricate since the InGaAs acts as an etch stop during steps to define collector and via hole structures. This arrangement protects the base contact layer and emitter layers from the etchants. Further by use of the narrow band gap III-V material between the substrate and emitter, better ohmic contact to the via hole is provided than that provided with wider band gap III-V materials.

In accordance with a still further aspect of the present invention, a method of providing an emitter down HBT includes the steps of providing an emitter region disposed on a substrate and providing a composite base over the emitter region. The base includes a stop etch layer and the layer which forms the heterojunction with the emitter. A collector layer is disposed on the stop etch layer of the composite base. With such an arrangement, when an etchant is brought into contact with the collector layer to define the collector region of the transistor and reveal the underlying base layer, the stop etch layer protects the underlying base layer from the etchant, since the stop etch layer is unaffected by the etchant. This technique also provides a smooth surface over the base layer which is used to provide relatively low resistivity ohmic contact to the base. In a preferred embodiment, a second InGaAs layer is provided between the substrate and emitter region. The second InGaAs layer provides a composite emitter which improves fabrication of the via hole and further permits improved ohmic contact between the emitter region and the ground plane conductor.

BRIEF DESCRIPTION OF THE DRAWINGS

The foregoing features of this invention, as well as the invention itself, may be more fully understood from the following detailed description of the drawings, in which:

FIGS. 1-6 are a series of cross-sectional views which show steps in the fabrication of a hetero-junction bipolar transistor in accordance with an aspect of the present invention;

FIGS. 7-12 are a second series of cross-sectional views of an alternate embodiment of a hetero-junction bipolar transistor in accordance with a further aspect of the present invention.

DESCRIPTION OF THE PREFERRED EMBODIMENTS

Steps in the fabrication of a hetero-junction bipolar transistor 30 having a grounded emitter provided by a plated via hole 28 (FIG. 6) will now be described in conjunction with FIGS. 1-6.

Figure 1:
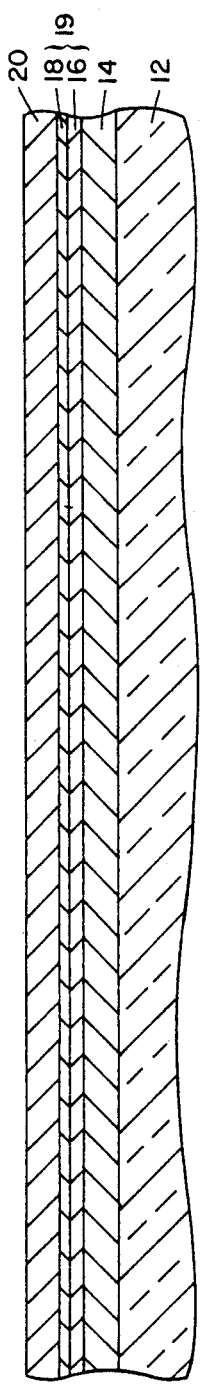

Referring now to FIG. 1, a substrate 12 here an n-type semi-insulating substrate comprised of gallium arsenide is shown having a plurality of layers disposed thereover. Disposed over a first surface of substrate 12 is a first layer 14 here comprised of a wideband gap material such as aluminum gallium arsenide having a selected compositional ratio of aluminum to gallium in the range of 10% to 40% with 30% being preferred and which is suitably doped n-type by introduction of silicon or other suitable Group IV material as a dopant. Typically, such a layer is doped in a range of $1 \times 10^{17}$ $cm^{-3}$ to $1 \times 10^{18}$ $cm^{-3}$. Layer 14 typically has a thickness in the range of 0.1 microns to 0.3 microns. Disposed over layer 14 is a layer 16 comprised of an intermediate band gap III-V material such as gallium arsenide which is doped with a p-type dopant here zinc or beryllium doped to a concentration of typically about $10^{20}$ $cm^{-3}$ to provide a highly conductive p-type doped layer. Layer 16 has a thickness in the range of about 500 A to 1000 A. Disposed over layer 16 is a layer 18 of a narrow band gap material such as indium gallium arsenide which is also suitably doped p-type with preferably Be as a dopant to a concentration in the range of $1 \times 10^{19}$ $cm^{-3}$ to $1 \times 10^{20}$ $cm^{-3}$ having a thickness of typically 50 A to 200 A. Layers 16 and 18 provide a composite highly p-type doped base layer 19. Disposed over layer 18 is a layer 20 comprised of an intermediate band gap III-V material such as gallium arsenide which is doped n-type. Layer 20 has a thickness typically in the range of 2000 A to 6000 A and a dopant concentration in the range of about $1 \times 10^{16}$ $cm^{-3}$ to $1 \times 10^{17}$ $cm^{-3}$.

Figure 2:
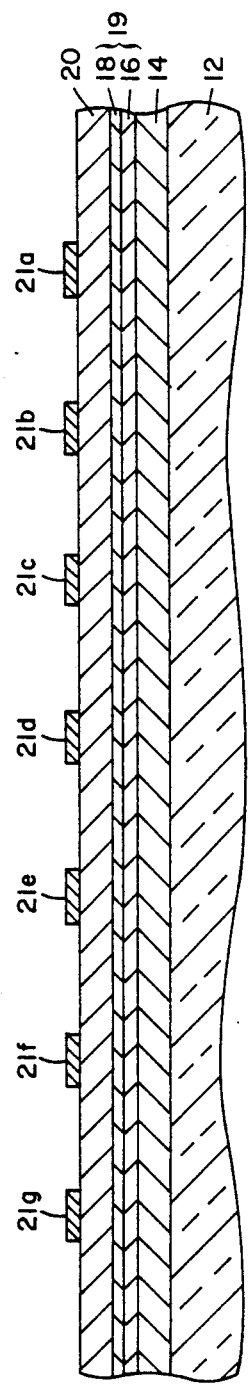
Figure 6A:
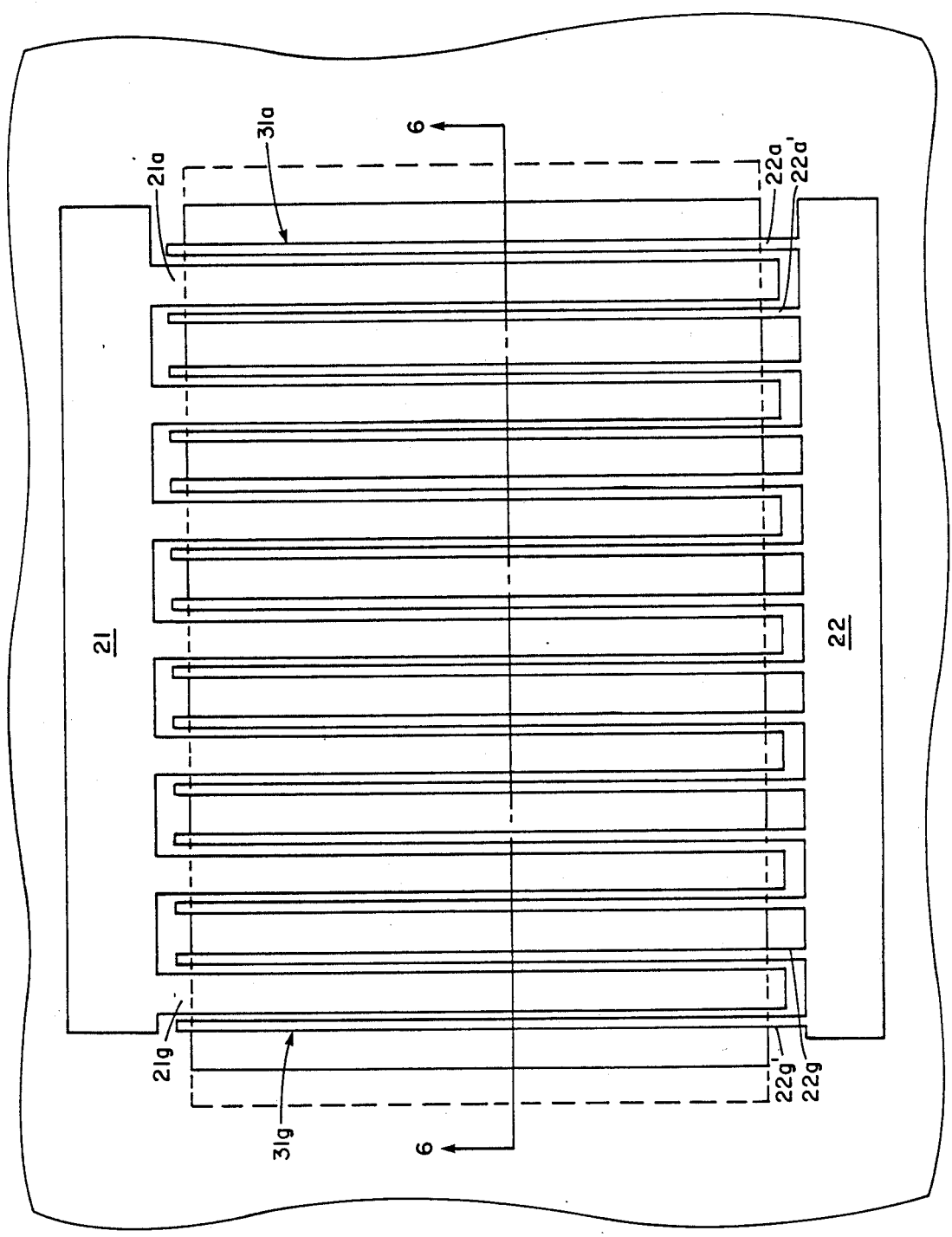
FIG. 6A is a plan view of a heterojunction bipolar transistor of FIG. 6 as fabricated in conjunction with FIGS. 1-6.

Referring now to FIG. 2, the substrate 12 having layers 14, 16, 18, and 20 as described above is provided with a plurality of spaced electrode contacts 21a-21g. Here said spaced electrode contacts 21a-21g are provided by depositing a conductive layer (not numbered) such as Pd-Ge-Au. Said conductive layer is patterned using well-known techniques such as selectively etching the layer to form the regions 21a-21g or depositing the layer through a photo-resist layer (not shown) which exposes selected underlying portions of layer 20 and lifting off the photo-resist as is also known to leave behind the contacts 21a-21g. Electrical contacts 21a-21g are alloyed with layer 20 to provide low resistivity ohmic contact to layer 20 and are used to provide here collector contacts for the HBT 30 (FIG. 6, 6A).

Figure 3:
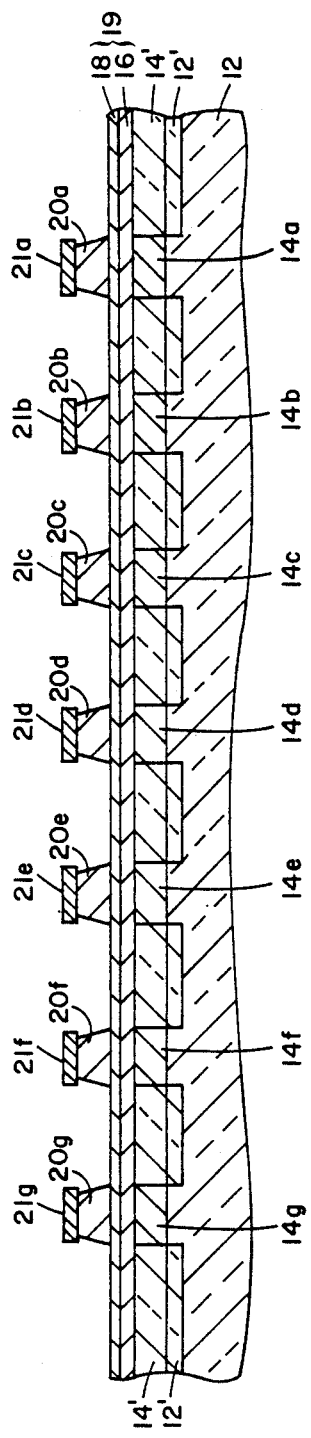

Referring now to FIG. 3, the layer 20 (FIG. 2) is etched into a plurality of individual, spaced collector regions 20a-20g as shown. Here the electrical contacts 21a-21g serve as a mask while etching layer 20 into regions 20a-20g. Here, the wafer is reactively ion etched using a mixture of $BCl_3$ and He vapors, which attack the layer 20 in regions thereof not covered by contacts 21a-21g. This etchant, however, does not similarly affect underlying layer 18. That is, here the etchant is selected to selectively etch layer 20 but not the material of layer 18 here the indium gallium arsenide (InGaAS). Thus, layer 18 acts as an etch stop layer when defining the collector regions 20a-20g and exposing the composite base region 19.

After the collector regions 20a-20g are provided, the collector regions 20a-20g and in particular contacts 21a-21g are also used to define individual, spaced emitter regions 14a-14g, as shown. That is, again using electrical contacts 21a-21g as masks, here the wafer is blanket implanted with a suitable impurity species at a suitable energy which will render the implanted regions semi-insulating. Since layers 16 and 18 which form the base are relatively thin layers of very highly doped p-type material, the implanted species does not significantly change the conductivity of said layers. However, in substrate 12 and the relatively lightly doped n-type layer 14, the implanted species renders portions 12',14' of said material which are not masked by the contacts 21a-21g semi-insulating. The implanted species is inhibited from penetrating through the collector regions 20a-20g via the collector contacts 21a-21g and thus the collector contacts also shade the base regions and the emitter regions 14a-14g disposed thereunder.

Figure 4:
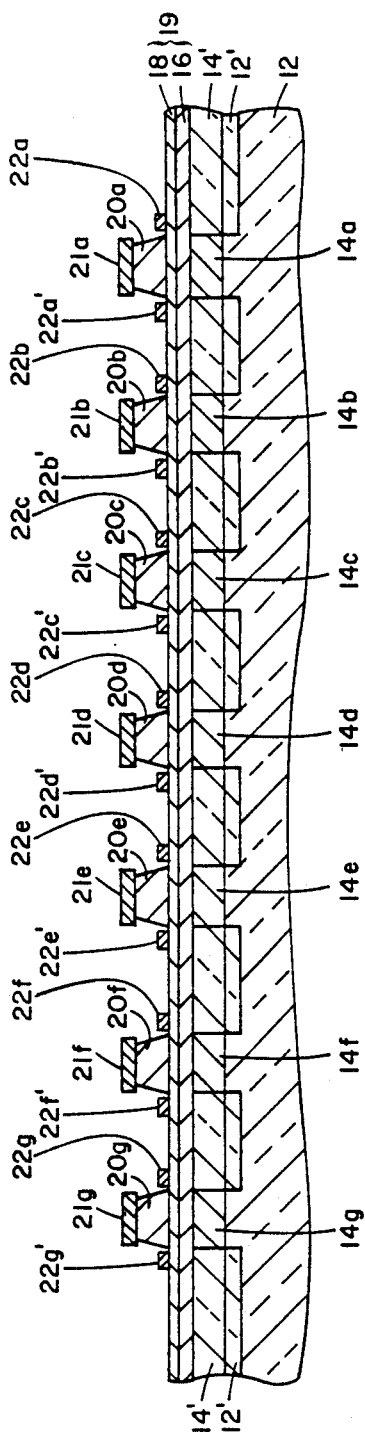

The emitter regions could also be defined by etching steps to isolate individual ones of such regions Referring now to FIG. 4, base contact pairs 22a, 22a' through 22g, 22g' are disposed over respective base regions, adjacent corresponding collector regions 20a-20g as shown. Here said base electrodes have a width of approximately 4 microns and are typically comprised of Pt-Ti-Au. The base contacts are disposed in low resistivity ohmic contact with layer 18. Since layer 18 is a low band gap material here of p-type indium gallium arsenide, relatively good ohmic contacts are provided to the base metal. This particular arrangement will overcome the base resistance problem common in conventional structures, while permitting the base emitter heterojunction to be comprised of p-type gallium arsenide and n-type AlGaAs.

Figure 5:
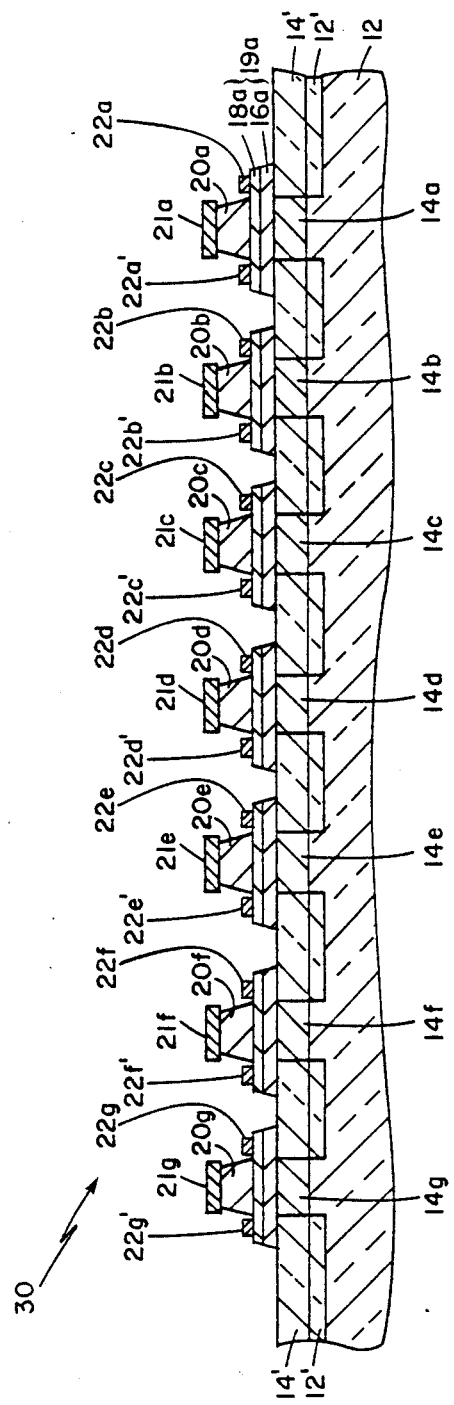

Referring now to FIG. 5, using the base contact layers 22a, 22a'-22g, 22g' and the collector contacts 21a-21g as masks, the base layers 16 and 18 (FIG. 4) are etched to provide individual composite base regions (19a being numbered) as shown. An etching solution of $H_2SO_4:H_2O_2:H_2O$ in 1:8:160 molar proportions may be used to isolate the base regions of the transistor elements.

Referring now to FIGS. 6, 6A, the first surface of substrate 12 is provided with an aperture 29 underlying the emitter regions 14a-14g to expose said emitter regions 14a-14g. The AlGaAs emitter provides a stop etch layer for precise control of via hole depth. A reactive ion etch using Freon-12 may be used to etch through the substrate 12. The aperture 29 is filled with a thermally and electrically conductive material 28 such as gold, thus providing a via hole 29 filled with a conductive deposit 28. A back plane conductor 26 (i.e. ground plane conductor) is disposed over the back surface of substrate 12 to provide thermal and electrical contact to the conductive deposit 28. Conventional via hole plating techniques may be used to provide the arrangement as shown in FIG. 6. One such technique is described in U.S. Pat. No. 4,794,093, Tong et al. and assigned to the assignee of the present invention. Other conventional techniques may also be employed.

As also shown in FIGS. 6, 6A, the heterojunction bipolar transistor (HBT) includes a plurality of individual transistor cells (31a, 31g being numbered) having base contact pairs (22a, 22a', 22g, 22g' being numbered) connected to a common base pad 22 and collector contacts 21a-21g connected to a common collector pad 21. The emitter contact for this transistor is provided by the ground plane conductor through the via hole 29 provided as shown in FIG. 6. With this particular arrangement, an "emitter down" structure which is relatively easy to fabricate by use of the indium gallium arsenide base etch stop layer is provided. Furthermore, by use of the via hole underlying the emitter, relatively easy grounding of the emitter is possible, thus permitting a grounded or common emitter HBT to be provided with a high quality microwave ground path.

In accordance with a further aspect of the present invention, an alternate embodiment 70 (FIG. 11) of a heterojunction bipolar transistor will be described in conjunction with FIGS. 7-12.

Figure 7:
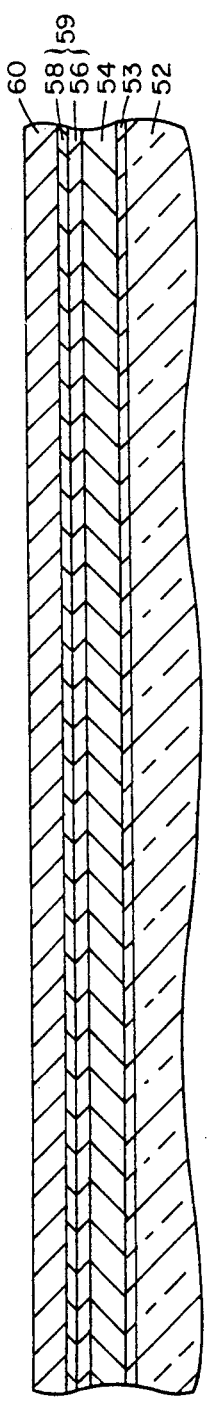

Referring now to FIG. 7, a substrate 52 here an n-type semi-insulating substrate comprised of gallium arsenide is shown. Disposed over a first surface of substrate 52 is a first layer 53 of here InGaAs, a narrow band gap material, doped n-type with a concentrate generally in excess of about $10^{20}$ cm$^{-3}$. Here, the ratio of In to Ga is about 10% In. A second layer 54 is disposed over the first layer 53 and here is comprised of a wide band gap material such as aluminum gallium arsenide having a selected compositional ratio of aluminum to gallium in the range of 10% to 40% with 30% being preferred and which is suitably doped n-type by introduction of silicon as a dopant. Typically, such a layer is doped in a range of $1 \times 10^{17}$ cm$^{-3}$ to $1 \times 10^{18}$ cm$^{-3}$. Layer 54 typically has a thickness in the range of 0.1 μm to 0.3 μm. Disposed over layer 54 is a layer 56 comprised of an intermediate band gap III-V material such as gallium arsenide which is doped with a p-type dopant here zinc or beryllium to a concentration of typically about $10^{20}$ cm$^{-3}$. Layer 56 has a thickness in the range of about 500 A to to 1000 A. Disposed over layer 56 is layer 58 of a said narrow band gap material, for example, as indium gallium arsenide (InGaAs) which is here suitably doped p-type with Be as a dopant to a concentration of $10^{19}$ cm$^{-3}$ to $10^{20}$ cm$^{-3}$ having a thickness typically 50 A to 200 A. Disposed over layer 58 is a layer 60 comprised of the intermediate band gap III-V material here gallium arsenide and which is also suitably doped n-type. Layer 60 has a thickness typically in the range of 2000 A to 6000 A and a dopant concentration in the range of about $1 \times 10^{16}$ cm$^{-3}$ to $1 \times 10^{17}$ cm$^{-3}$.

Figure 8:
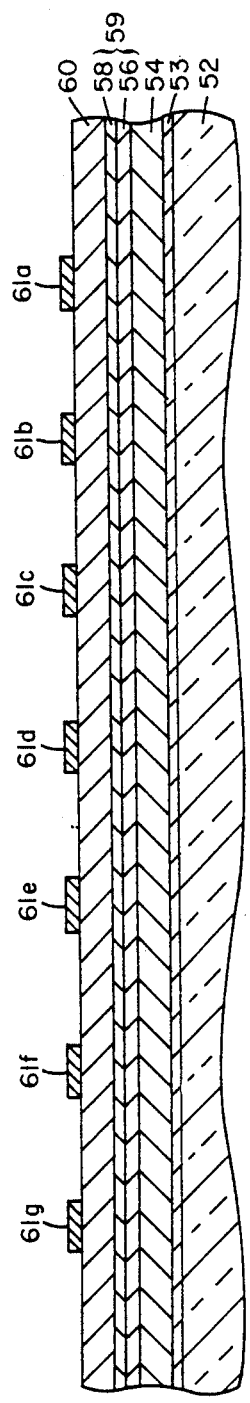

Referring now to FIG. 8, the substrate 52 having layers 54, 56, 58, and 60 as described above is shown to include a plurality of spaced electrode contacts 61a-61g as generally described for contacts 21a-21g of FIG. 2. Contacts 61a-61g are alloyed with layer 60 to provide ohmic contact to layer 60 and are used to provide here collector contacts for the HBT 70 (FIG. 11).

Figure 9:
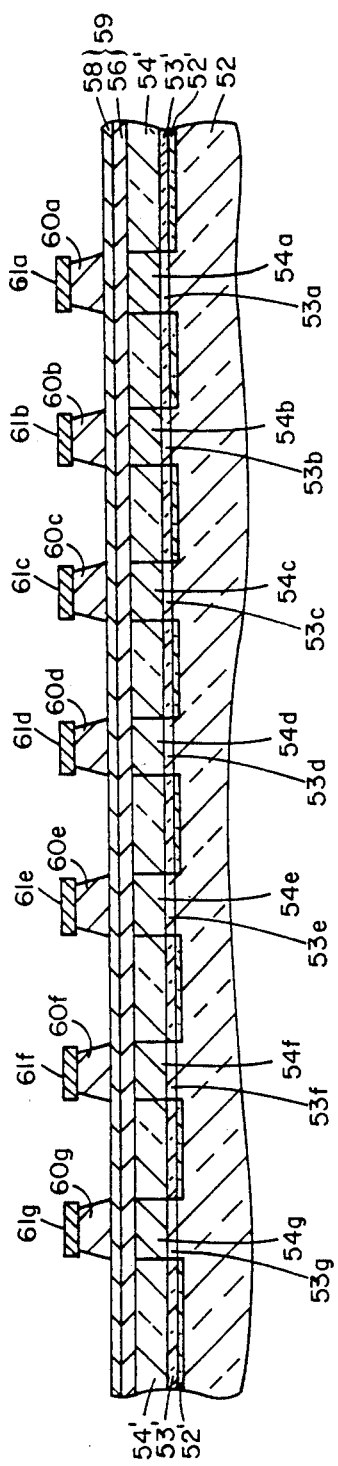

Referring now to FIG. 9, the layer 60 (FIG. 8) is etched into a plurality of collector regions 60a-60g as described in FIG. 3 by using here collector contacts 61a-61g disposed over collector regions 60a-60g as a mask. Here as in FIG. 3, the indium gallium arsenide acts as an etch stop layer in defining the collector regions 60a-60g.

After the collector regions 60a-60g are formed, the emitter regions are also defined in layer 54 as was for layer 14 (FIG. 2) by using electrical contacts 61a-61g as masks during a blanket ion implantion step. The unmasked regions are implanted with a suitable doping specie which renders such implanted regions semi-insulating. Since layers 56 and 58 which form the composite 59 base are relatively thin layers of highly doped p-type material, the implanted specie does not significantly change the conductivity of said layers. However, in the relatively lightly doped n-type layers 54 and 53, the implanted specie such as ($O_2^+$ or $B^+$) renders said material semi-insulating as denoted by the regions 52'-54'. The implanted specie is inhibited from penetrating through the collector regions 60a-60g by the collector contacts 61a-61g. The collector contacts 60a-60g also shade the base regions (not numbered) and the emitter regions 53a-53g and 54a-54g disposed thereunder, as shown.

Referring now to FIG. 10, base contact electrode pairs 62a, 62a' through 62g, 62g' are disposed over respective base regions, adjacent corresponding collector regions 60a-60g as described in conjunction with FIG. 4 for electrodes 22a, 22a'-22g, 22g'.

Referring now to FIG. 11, using the base contact layers 62a, 62a'-62g, 62g' and the emitter contacts 61a-61g as masks, the base layers 58 and 60 (FIG. 10) are etched to provide individual composite base regions (not numbered) as shown. The base etch is used to isolate the base regions of the transistor elements.

The etching technique may be either a reactive ion etch or a wet chemical etch such as a mixture of $H_2SO_4:H_2O_2:H_2O$ in 1:8:160 proportions.

Referring now to FIG. 12, the first surface of substrate 52 is provided with an aperture 69 underlying the emitter regions 54a-54g and 53a-53g to expose said emitter regions. The aperture 69 is provided with a thermally and electrically conductive material 68 such as gold, thus providing a via hole filled with a conductive deposit 68. Layer 53 and regions 53a-53g act as an etch stop when etching the via hole to expose the emitter regions. Further, regions 53a-53g also provides relatively low resistivity ohmic contact between the deposit 68 and the emitter regions 60a-60g. A back plane conductor 66 (i.e. ground plane conductor) is disposed over the back surface of substrate 52 to provide thermal and electrical contact thereto as generally described for 26 and 28 (FIG. 6).

As shown now in FIG. 12, the hetero-structure bipolar transistor includes a composite base and emitter, each comprised of a narrow band gap material which during device fabrication provides a stop etch layer particular during the critical collector etch to define base contact regions, and also provides relatively good ohmic contact to both the base layer to reduce base parasitic resistance and the emitter layer to improve performance by reducing emitter contact resistance. With this particular arrangement, an emitter down structure having all of the fabrication advantages and electrical performance advantages of that shown in FIG. 6 is provided, with the further advantages of better ohmic contact to the emitter region by use of the narrow band gap layer. Since the emitter is comprised of a wider band gap material i.e. AlGaAs, good ohmic contact is even more difficult than with GaAs. The InGaAs alleviates this problem.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A heterojunction bipolar transistor, comprising:
   a substrate having first and second opposing surfaces with a ground plane conductor disposed over a first surface thereof;
   a first layer comprised of a first wide band gap Group III-V material disposed over at least a portion of the second surface of said substrate;
   a composite base layer comprising:
   (i) a second layer comprised of a second, different Group III-V material disposed over said first layer having a narrower band gap than the material of the first layer;
   (ii) a third layer of a third, different Group III-V material disposed over said second layer having a narrower band gap than the first and second materials;
   a fourth layer of said second Group III-V material disposed over said third layer;
   first means for providing an ohmic collector contact to said fourth layer; and
   second means for providing an ohmic base contact to said third layer.

2. The transistor of claim 1 wherein said substrate is comprised of GaAs, said wideband gap first Group III-V material is AlGaAs, said second Group III-V material is GaAs, and said third Group III-V material is InGaAs.

3. The transistor of claim 2 wherein said first layer of AlGaAs is doped with Si to a concentration in the range of about $1 \times 10^{17}$ to $1 \times 10^{18}$ cm$^{-3}$, said second layer of GaAs is doped with a p-type dopant selected from the group consisting of Be and Zn to a concentration of about $10^{20}$ cm$^{-3}$, said third layer comprised of InGaAs is doped with Be to a dopant concentration of $1 \times 10^{19}$ cm$^{-3}$ to $1 \times 10^{20}$ cm$^{-3}$, and said fourth layer of GaAs is doped with Si to a concentration of about $1 \times 10^{16}$ to $1 \times 10^{17}$ cm$^{-3}$.

4. The transistor of claim 3 further comprising means for electrically and thermally connecting said first layer to said ground plane conductor.

5. The transistor of claim 4 wherein said substrate has a void underlying said first layer and wherein said means is a solid deposit of conductive material disposed in said void to provide an ohmic emitter contact to said first layer.

6. The transistor of claim 5 further comprising means for rendering selected portions of said first layer semi-insulating.

7. The transistor of claim 6 wherein said rendering means includes an impurity species disposed in said selected portions of the material of said first layer in a region thereof underlying a portion of said composite base to render said material of the first layer semi-insulating.

8. The transistor of claim 1 further comprising means for rendering selected portions of said first layer semi-insulating.

9. The transistor of claim 8 wherein said rendering means includes an impurity species disposed in said selected portions of the material of said first layer in a region thereof underlying a portion of said composite base to render said material of first layer semi-insulating.

10. A heterojunction bipolar transistor, comprising:
    a substrate having first and second opposing surfaces with a ground plane conductor disposed over a first surface thereof;
    a composite emitter layer comprising:

(i) a first layer comprised of a first narrow band gap, Group III-V material disposed on said substrate;

(ii) a second layer comprised of a second, different wide band gap Group III-V material disposed over at least a portion of the first layer;

a composite base comprising:

(i) a third layer of a third, different Group III-V material disposed over said second layer having a band gap between that of the material of the first layer of the material of the second layer;

(ii) a fourth layer comprised of said first Group III-V material disposed over said second layer;

a fifth layer comprised of said third Group III-V material disposed over said fourth layer;

first means for providing an ohmic collector contact to said fifth layer;

second means for providing an ohmic base contact to said fourth layer; and third means for providing an ohmic emitter contact to said first layer.

11. The transistor of claim 10 wherein said said substrate is comprised of GaAs, said first Group III-V material is InGaAs, said second wideband gap Group III-V material in AlGaAs, and said third Group III-V material is GaAs.

12. The transistor of claim 11 wherein said first layer of InGaAs is doped N-typed with Si to a concentration of about $10^{20}$ cm$^{-3}$, the second layer of AlGaAs is doped with Si to a concentration in the range of about $10^{17}$ to $10^{18}$ cm$^{-3}$, said third layer of GaAs is doped with a p-type dopant selected from the group consisting of Be and Zn to a concentration of about $10^{20}$ cm$^{-3}$, said fourth layer of InGaAs is doped with Be to a dopant concentration of $1 \times 10^{19}$ cm$^{-3}$ to $1 \times 10^{20}$ cm$^{-3}$, and said fifth layer of GaAs is doped with Si to a concentration of about $10^{16}$ cm$^{-3}$ to $10^{17}$ cm$^{-3}$.

13. The transistor of claim 12 further comprising means for electrically and thermally connecting said first layer to said ground plane conductor.

14. The transistor of claim 13 wherein said substrate has a void underlying said first layer and wherein said means is a solid deposit of material disposed in said void.

15. The transistor of claim 14 further comprising means for rendering selected portions of said first layer semi-insulating.

16. The transistor of claim 15 wherein said rendering means include an impurity species disposed in said selected portions of the material of said first layer in a region thereof underlying a portion of said composite base to render said material of the first layer semi-insulating.

17. The transistor of claim 10 further comprising means for rendering selected portions of said first layer semi-insulating.

18. The transistor of claim 17 wherein said rendering means includes an impurity species disposed in selected portion of the material of said first layer in a region thereof underlying a portion of said composite base to render said material of the first layer semi-insulating.

* * * * *